(12) United States Patent
Chen et al.

(10) Patent No.: US 10,133,098 B2
(45) Date of Patent: Nov. 20, 2018

(54) MOS CAPACITOR OPTICAL MODULATOR WITH TRANSPARENT CONDUCTIVE AND LOW-REFRACTIVE-INDEX GATE

(71) Applicant: Futurewei Technologies, Inc., Plano, TX (US)

(72) Inventors: Hongmin Chen, Davis, CA (US); Qianfan Xu, San Jose, CA (US); Li Yang, San Jose, CA (US); Xiao Shen, San Bruno, CA (US); Dawei Zheng, Irvine, CA (US); Yusheng Bai, Los Altos Hills, CA (US); Hongbing Lei, San Jose, CA (US); Eric Dudley, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 61 days.

(21) Appl. No.: 14/689,601

(22) Filed: Apr. 17, 2015

(65) Prior Publication Data

US 2015/0301363 A1 Oct. 22, 2015

Related U.S. Application Data

(60) Provisional application No. 61/984,961, filed on Apr. 28, 2014, provisional application No. 61/981,517, filed on Apr. 18, 2014.

(51) Int. Cl.
*G02F 1/025* (2006.01)
*G02B 6/13* (2006.01)
(Continued)

(52) U.S. Cl.
CPC ............... *G02F 1/025* (2013.01); *G02B 6/13* (2013.01); *H01L 29/0649* (2013.01);
(Continued)

(58) Field of Classification Search
None
See application file for complete search history.

(56) References Cited

U.S. PATENT DOCUMENTS 4,325,747 A 4/1982 Ristow
6,298,177 B1 10/2001 House
(Continued)

FOREIGN PATENT DOCUMENTS

CN 1908795 A 2/2007
JP S54152872 A 12/1979
(Continued)

OTHER PUBLICATIONS

Kim, H., et al, "Electrical, optical and structural properties of indium-tin-oxide thin films for organic light emitting devices," Journal of Applied Physics, vol. 86, No. 11, Dec. 1999, pp. 6451-6461.
(Continued)

*Primary Examiner* — Michelle R Connelly
(74) *Attorney, Agent, or Firm* — Conley Rose, P.C.

(57) ABSTRACT

A metal-oxide semiconductor (MOS) optical modulator including a doped semiconductor layer having a waveguide structure, a dielectric layer disposed over the waveguide structure of the doped semiconductor layer, a gate region disposed over the dielectric layer, wherein the gate region comprises a transparent electrically conductive material having a refractive index lower than that of silicon, and a metal contact disposed over the gate region. The metal contact, the gate region, and the waveguide structure of the doped semiconductor layer may be vertically aligned with each other.

20 Claims, 5 Drawing Sheets

(51) Int. Cl.
| | |
|---|---|
| H01L 29/94 | (2006.01) |
| H01L 29/06 | (2006.01) |
| H01L 29/167 | (2006.01) |
| H01L 29/49 | (2006.01) |
| H01L 29/51 | (2006.01) |
| H01L 29/66 | (2006.01) |
| G02B 6/12 | (2006.01) |
| G02F 1/015 | (2006.01) |

(52) U.S. Cl.
CPC ........ *H01L 29/167* (2013.01); *H01L 29/4966* (2013.01); *H01L 29/51* (2013.01); *H01L 29/518* (2013.01); *H01L 29/66181* (2013.01); *H01L 29/94* (2013.01); *G02B 2006/12061* (2013.01); *G02B 2006/12142* (2013.01); *G02F 2001/0151* (2013.01)

(56) References Cited

U.S. PATENT DOCUMENTS

| | | | | |
|---|---|---|---|---|
| 8,213,751 | B1 * | 7/2012 | Ho | G02B 6/305 385/1 |
| 2010/0215309 | A1 * | 8/2010 | Shubin | B82Y 20/00 385/3 |
| 2011/0211786 | A1 | 9/2011 | Ushida et al. | |
| 2012/0003767 | A1 | 1/2012 | Fujikata et al. | |

FOREIGN PATENT DOCUMENTS

| | | |
|---|---|---|
| JP | 2002540469 A | 11/2002 |
| JP | 2011180595 A | 9/2011 |
| JP | 2013214044 A | 10/2013 |
| WO | 2010103891 A1 | 9/2010 |

OTHER PUBLICATIONS

Foreign Communication From a Counterpart Application, PCT Application No. PCT/US2015/026386, International Search Report dated Jul. 20, 2015, 4 pages.
Foreign Communication From a Counterpart Application, PCT Application No. PCT/US2015/026386, Written Opinion dated Jul. 20, 2015, 7 pages.
Soref, "Elecrooptical Effects in Silicon," IEEE Journal of Quantum Electronics, vol. QE-23, No. 1, Jan. 1987, pp. 123-129.
Chen, et al., "Low Specific Contact Resistance Ti/Au Contacts in ZnO," Applied Physics Letters 88, 122107, 2006, 3 pages.
Della Corte, et al., "Electro-Optical Modulation at 1550 nm in an As-Deposited Hydrogenated Amorphous Silicon p-i-n Waveguiding Device," Optics Express, 2941 vol. 19, No. 4, Feb. 14, 2011, 11 pages.
Dong, et al., "High-Speed Low-Voltage Single-Drive Push-Pull Silicon Mach-Zehnder Modulators," Optics Express 6163, vol. 20, No. 6, Mar. 12, 2012, 7 pages.
Feigenbaum, et al., "Unity-Order Index Change in Transparent Conducting Oxides at Visible Frequencies," Nano Letters, American Chemical Society, 2010, vol., pp. 2111-2116.
Fujikata, et al., "High Performance PIN Ge Photodetector and Si Optical Modulator with MOS Junction for Photonics-Electronics Convergence System," IEEE, 2013, pp. 655-656.
Gill, et al., "A Figure of Merit-Based Electro-Optic Mach-Zehnder Modulator Link Penalty Estimate Protocol," http://arxiv.org/ftp/arxiv/papers/1211/1211.2419.pdf., downloaded from the Internet, Apr. 16, 2014, 4 pages.
Liao, et al., "High Speed Silicon Mach-Zehnder Modulator," Optics Express 3129, vol. 13, No. 8, Apr. 18, 2005, 7 pages.
Ma., et al., "Carrire Concentration Dependence of Terahertz Transmission on Conducting ZnO Films," American Institute of Phyics, Applied Physics Letters, vol. 93, 2008, 3 pages.
Masaud, et al., "Compact Fabry-Perot Electro-Optic Switch Based on n-ZnO/p-Si Heterojunction Structure," 12th IEEE International Conference on Nanotechnology (IEEE-NANO), The International Conference Centre Birmingham, Aug. 20-23, 2012, Birmingham, United Kingdom, 3 pages.
Paramahans, et al., "ZnO: An Attractive Option for N-Type Metal-Interfacial Layer-Semiconductor (Si, Ge, SiC) Contacts," 2012 Symposium on VLSI Technology Digest of Technical Papers, IEEE, pp. 83-24.
Rosenberg, et al., "A 25 Gbps Silicon Microring Modulator Based on an Interleaved Junction," Optics Express 26411, vol. 20, No. 24, Nov. 19, 2012, 13 pages.
Van Campenhout, et al., "Low-Voltage, Low-Loss, Multi-Gb/s Silicon Micro-Ring Modulator Based on a MOS Capacitor," OFC/NFOEC Technical Digest, 2012, 3 pages.
Watts, et al., "Low-Voltage, Compact, Depletion-Mode, Silicon Mach-Zehnder Modulator," IEEE Journal of Selected Topics in Quantum Electronics, vol. 16, No. 1, Jan./Feb. 2010, pp. 159-163.
Wu, et al., "A 20Gb/s NRZ/PAM-4 1V Transmitter in 40nm CMOS Driving a Si-Photonic Modulator in 0.13 μm CMOS," ISSCC 2013, Session 7, Optical Transceivers and Silicon Photonics, 7.7, IEEE International Solid-State Circuits Conference, 2013, pp. 128-130.
Xiao, et al., "25 Gbit/s Silicon Microoring Modulator Based on Misalignment-Tolerant Interleaved PN Junctions," Optics Express 2507, vol. 20, No. 3, Jan. 30, 2012, 9 pages.
Xu, et al., "Organic Electro-Optic Modulator Using Transparent Conducting Oxides as Electrodes," Optics Express 7380, vol. 13, No. 19, Sep. 19, 2005, 6 pages.
Yi, et al., "Modeling and Design of High-Speed Ultralow Voltage GaAs Electro-Optic Modulators Enabled by Transparent Conducting Materials," Journal of Lightwave Technology, vol. 30, No. 12, Jun. 15, 2012, pp. 1-9.
You, et al., "Electroluminescence Behavior of ZnO/Si Heterojunctions: Energy Band Alignment and Interfacial Microstructure," Journal of Applied Physics 107, 083701, 2010, 5 pages.
Machine Translation and Abstract of Japanese Publication No. JP2013214044, Oct. 17, 2013, 24 pages.
Machine Translation and Abstract of Chinese Publication No. CN1908795, Feb. 7, 2007, 12 pages.
Foreign Communication From a Counterpart Application, Chinese Application No. 201580018242.6, Chinese Office Action dated Aug. 28, 2018, 8 pages.

* cited by examiner

US 10,133,098 B2

MOS CAPACITOR OPTICAL MODULATOR WITH TRANSPARENT CONDUCTIVE AND LOW-REFRACTIVE-INDEX GATE

CROSS-REFERENCE TO RELATED APPLICATIONS

This patent application claims priority to U.S. Provisional Patent Application No. 61/981,517 filed Apr. 18, 2014, by Hongmin Chen, et al., and entitled "MOS Capacitor Optical Modulator with Transparent Conductive and Low-Refractive-Index Gate," which is incorporated herein by reference as if reproduced in its entirety. This application also claims the benefit of U.S. Provisional Patent Application No. 61/984,961 filed Apr. 28, 2014, by Dawei Zheng, et al, and entitled "Optical Modulator with Dynamic Random Access memory (DRAM)-Like Cross Section."

STATEMENT REGARDING FEDERALLY SPONSORED RESEARCH OR DEVELOPMENT

Not applicable.

REFERENCE TO A MICROFICHE APPENDIX

Not applicable.

BACKGROUND

Silicon (Si) photonic devices may refer to photonic devices that use silicon as an optical medium in a chip. Silicon photonic devices may operate in the infrared wavelength region typically used by fiber optic telecommunication systems. Silicon may lie on top of a layer of silicon dioxide ($SiO_2$), or silica, and function as a silicon-on-insulator (SOI). Silicon photonic devices may be made using existing semiconductor fabrication techniques.

Because silicon is typically used as the substrate for integrated circuits, hybrid devices may comprise both optical and electronic components integrated onto a single chip. Such hybrid devices may provide for electrical data operations, but also provide for optical interconnects that may allow for faster data transfer between and within chips. As a result, there is an increased interest in silicon photonics.

SUMMARY

In one embodiment, the disclosure includes a metal-oxide semiconductor (MOS) optical modulator including a doped semiconductor layer having a waveguide structure, a dielectric layer disposed over the waveguide structure of the doped semiconductor layer, a gate region disposed over the dielectric layer, wherein the gate region comprises a transparent electrically conductive material having a refractive index lower than that of silicon, and a metal contact disposed over the gate region.

In one embodiment, the disclosure includes a metal-oxide semiconductor (MOS) optical modulator including a semiconductor-on-insulator (SOI) wafer portion having an upper semiconductor layer disposed over a buried oxide formed on a semiconductor substrate, wherein the upper semiconductor layer includes a waveguide structure, a dielectric layer disposed over the waveguide structure of the upper semiconductor layer, a gate region disposed over the dielectric layer, wherein the gate region comprises a transparent electrically conductive material having a refractive index lower than that of silicon, and a metal contact disposed over the gate region, wherein sidewalls of the metal contact are co-planar with sidewalls of the gate region and with sidewalls of the waveguide structure of the upper semiconductor layer.

In one embodiment, the disclosure includes a method of forming a metal-oxide semiconductor (MOS) optical modulator including forming a waveguide structure in a semiconductor layer, forming a dielectric layer over the waveguide structure of the semiconductor layer, depositing a gate region material over the dielectric layer, wherein the gate region material comprises a transparent electrically conductive material having a refractive index lower than that of silicon, and forming a metal contact over the gate region material.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Optical modulators are key building blocks of silicon photonic devices on SOI platforms. Optical modulators may be formed using an interferometer such as Mach-Zehnder interferometer and a ring oscillator. The modulator efficiency, optical insertion loss, and modulation bandwidth may be defined by the phase section within the interferometer. The refractive index of the phase section may be changed by applying voltage, which may change electron and hole density. The change to the refractive index may change the intensity and phase of the interferometer output.

Currently, two primary optical modulators are used: a PN junction optical modulator and a MOS capacitor optical modulator. PN junction optical modulators may obtain high-speed modulation through the carrier depletion effect, and MOS capacitor optical modulators may obtain high-speed modulation through the carrier accumulation effect. However, MOS capacitor optical modulators generally have higher modulation efficiencies than PN junction optical modulators. The higher modulation efficiency may allow for smaller sizes and lower driving voltages, thus making MOS capacitor optical modulators more attractive.

MOS capacitor optical modulators are based on carrier density changes induced by voltage changes across the electrodes of the capacitor. Existing MOS capacitor optical modulators typically comprise implanted polysilicon above the gate oxide to connect the metal electrodes to the gate. The metal contact of the gate region is placed relatively laterally far away from the waveguide region to avoid optical insertion loss, but that is done at the expense of serial resistance so that a proper balancing of optical loss versus resistance is needed. In addition, the placement of the metal contact may cause significant parasitic capacitance, which may limit the modulation bandwidth.

Figure 1:
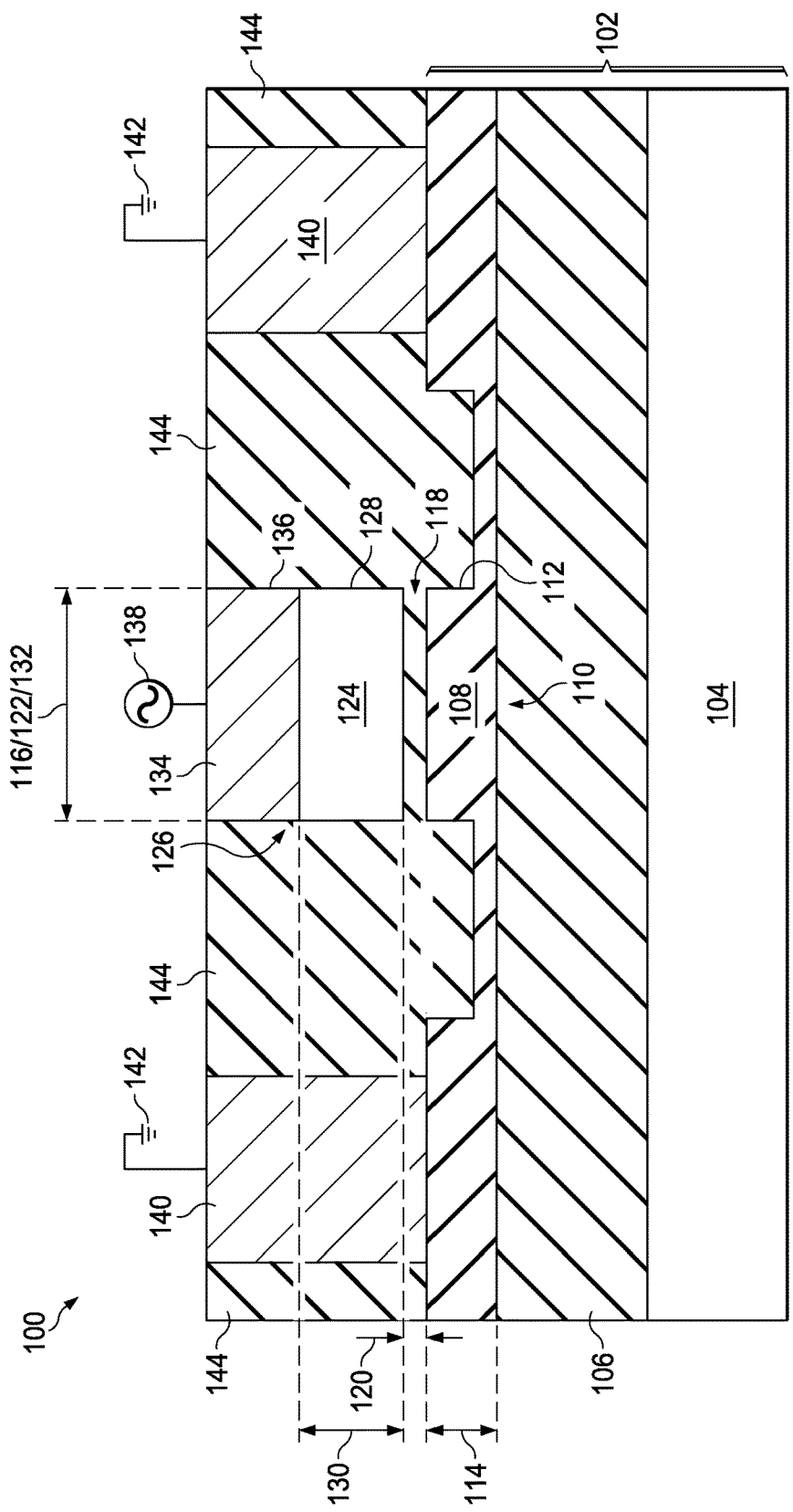
FIG. 1 is a schematic diagram of a MOS capacitor optical modulator according to an embodiment of the disclosure.

FIG. 1 is a schematic diagram of a MOS capacitor optical modulator 100 according to an embodiment of the disclosure. The modulator 100 offers improvements over existing MOS capacitor optical modulators. The modulator 100 offers a variety of benefits and advantages including, for example, higher modulation efficiency (e.g., $V\pi L$, where $V\pi$ is the applied voltage to achieve a $\pi$ phase shift for a given length of modulator phase section L), lower optical insertion loss (e.g., $V\pi Loss$, where $V\pi$ is the applied voltage to achieve a $\pi$ phase shift for a given length of modulator phase section L and Loss is the propagation loss of the phase section), and higher modulation bandwidth (e.g., $1/(2\pi RC)$, where R is resistance and C is capacitance) relative to existing MOS capacitor optical modulators.

As shown in FIG. 1, the modulator 100 is formed upon a portion of an SOI wafer 102 having a semiconductor substrate 104, an insulator 106, and an upper semiconductor layer 108. In an embodiment, the semiconductor substrate 104 is formed from silicon, a silicon-containing material, or another suitable substrate material. The insulator 106 is disposed over the semiconductor substrate 104. In an embodiment, the insulator 106 is a buried oxide (BOX) such as, for example, silicon dioxide or another suitable insulator. The upper semiconductor layer 108 is disposed over the insulator 106. In an embodiment, the upper semiconductor layer 108 is formed from silicon or another suitable semiconductor material.

The upper semiconductor layer 108 includes a waveguide structure 110. The waveguide structure 110 may be formed by, for example, etching away portions of the upper semiconductor layer 108. In an embodiment, the waveguide structure 110 defines sidewalls 112. While the sidewalls 112 of the upper semiconductor layer 108 are depicted as vertical in FIG. 1, it should be recognized that the sidewalls 112 may be slightly rounded or sloped due to semiconductor fabrication processes.

In an embodiment, the upper semiconductor layer 108 comprises silicon having p-type impurities (e.g., boron, indium, gallium, etc.) implanted therein. In an embodiment, the doping concentration varies within the upper semiconductor layer 108. For example, the doping concentration of the upper semiconductor layer 108 proximate a source (S) of the modulator 100 may be less than the doping concentration of the upper semiconductor layer 108 proximate a drain (D) of the upper semiconductor layer 108. By giving the upper semiconductor layer 108 proximate the drain a higher doping concentration, the serial and metal contract resistance within the modulator 100 may be reduced.

In an embodiment, the doping concentration of the source, which is proximate the waveguide structure 110, is about $5\times10^{17}$ atoms per centimeter cubed ($cm^3$). In an embodiment, the waveguide structure 110 has a thickness 114 between about 100 nanometers (nm) to about 220 nm. In an embodiment, the waveguide structure 110 has a width 116 between about 300 nm to about 1000 nm.

A dielectric layer 118 (e.g., a gate oxide) is disposed over the waveguide structure 110 of the upper semiconductor layer 108. In an embodiment, the dielectric layer 118 is formed by oxidizing the silicon of the waveguide structure 110 to form a relatively thin layer of silicon dioxide. The dielectric layer 114 may also comprise silica, silicon nitride, or another suitable material in other embodiments. In an embodiment, the dielectric layer 118 has a thickness 120 between about 5 nm to about 10 nm. In an embodiment, the dielectric layer 118 has a width 122 equivalent to the width 116 of the waveguide structure 110.

A gate region 124 is disposed over the dielectric layer 118. The gate region 124, the dielectric layer 118, and the waveguide structure 110 of the upper semiconductor layer 108 collectively form all or a portion of a waveguide 126 of the modulator 100. The waveguide 126 is utilized to propagate an optical signal through the modulator 100 in a desired fashion. The optical mode of the modulator 100 may be confined laterally by the optical waveguide 126, which may be formed by etching the gate region 122 and partially etching the upper semiconductor layer 108. In addition, the optical mode of the modulator 100 may be confined vertically by the waveguide structure 110, which may have a high refractive index.

In an embodiment, the gate region 122 is formed from an electrically conductive material. In an embodiment, the gate region 124 is formed from a material that is transparent in an optical telecommunications wavelength band between 1.3 micrometers (µm) and 1.55 µm. In an embodiment, the gate region 124 has a refractive index (e.g., about 1.9) lower than that of silicon (e.g., about 3.5). When these parameters are met by the gate region 124, the modulator 100 has a low insertion loss and high modulation speed.

In an embodiment, the gate region 124 is formed from zinc oxide (ZnO), silicon carbide (SiC), indium tin oxide (ITO), or another suitable material meeting the above-noted parameters. For example, the gate region 124 may be formed from a zinc oxide having n-type impurities (e.g., phosphorus, arsenic, antimony, aluminum, molybdenum, etc.) implanted therein. In an embodiment, the doping concentration of the gate region 124 is about $5\times10^{18}$ atoms per $cm^3$.

In an embodiment, the gate region 124 is disposed directly upon the dielectric layer 118 such that a bottom surface of the gate region 124 abuts against a top surface of the dielectric layer 118. In an embodiment, the gate region 124 is disposed directly vertically above the dielectric layer 118 and the waveguide structure 110. In other words, the gate region 124, the dielectric layer 118, and the waveguide structure 110 are vertically aligned with each other. In an embodiment, sidewalls 128 of the gate region 124 are generally or substantially co-planar with the sidewalls 112 of the underlying waveguide structure 110. While the sidewalls 128 of the gate region 124 are depicted as vertical in FIG. 1, it should be recognized that the sidewalls 128 may be slightly rounded or sloped due to semiconductor fabrication processes. In an embodiment, the gate region 124 has a thickness 130 between about 200 nm to about 1000 nm. In an embodiment, the gate region 124 has a width 132 equivalent to the width 122 of the dielectric layer 118 and the width 116 of the waveguide structure 110.

A metal contact 134 is disposed over the gate region 124. The metal contact 134 may be formed from, for example, aluminum, tungsten, copper, or another suitable electrically conductive material. In an embodiment, the metal contact 134 is disposed directly upon the gate region 124 such that a bottom surface of the metal contact 134 abuts against a top surface of the gate region 124. In an embodiment, the metal contact 134 is disposed directly vertically above the gate region 124, the dielectric layer 118, and the waveguide structure 110. In other words, metal contact 134, the gate region 124, the dielectric layer 118, and the waveguide structure 110 are vertically aligned with each other. Such a configuration may provide for higher modulation efficiency (VπL), lower optical insertion loss (VπLoss), and higher modulation bandwidth (1/(2πRC)). Also, light is confined vertically in the waveguide structure 110 of the upper silicon layer 108 and not absorbed by the metal contact 134 due to the gate region 124.

In an embodiment, sidewalls 136 of the metal contact 134 are generally or substantially co-planar with the sidewalls 128 of the underlying gate region 124. While the sidewalls 136 of the metal contact 134 are depicted as vertical in FIG. 1, it should be recognized that the sidewalls 136 may be slightly rounded or sloped due to semiconductor fabrication processes. The metal contact 134 may be electrically coupled to a voltage source 138 as shown in FIG. 1.

Metal contacts 138 are disposed over the upper silicon layer 108 proximate the drain of the modulator 100. The metal contacts 138 may be formed from, for example, aluminum, tungsten, copper, or another suitable electrically conductive material. The metal contacts 138 may be electrically coupled to a ground 142 as shown in FIG. 1. A cladding material 144 may be formed around the waveguide 126, the metal contact 134, and the metal contacts 140. As such, the sidewalls 112 of the waveguide structure 110 of the upper semiconductor layer 104, the sidewalls 128 of the gate region 124, and the sidewalls 136 of the metal contact 134 are covered by the cladding material 144. In an embodiment, the cladding material 144 has a refractive index (e.g., about 1.45) lower than that of the gate region 124 (e.g., about 1.9). In an embodiment, the cladding material 144 is silicon dioxide or another suitable cladding material.

By having a refractive index lower than the upper semiconductor layer 108, the gate region 124 may have a metal contact 134 placed on top of it without introducing excessive optical loss. Vertically placing the metal contact 134 may reduce the serial resistance and parasitic capacitance, thus allowing for a higher modulation bandwidth for the modulator 100. When compared to silicon, zinc oxide may have a similar effective mass, but a lower refractive index, which may result in a high electro-optical efficiency and lower insertion loss compared to n-doped silicon.

With the metal contact 134 on top of the waveguide 126 as shown in FIG. 1, the area of the serial resistance path in the gate region 124 may be increased, which may lead to a reduction of the serial resistance of the gate region 124. In addition, existing approaches may have a metal contact on only one side of the waveguide. In contrast, with the two metal contacts 138 in parallel with the waveguide 126, the modulator 100 may reduce the serial resistance of the waveguide 126 by about half.

Figure 2:
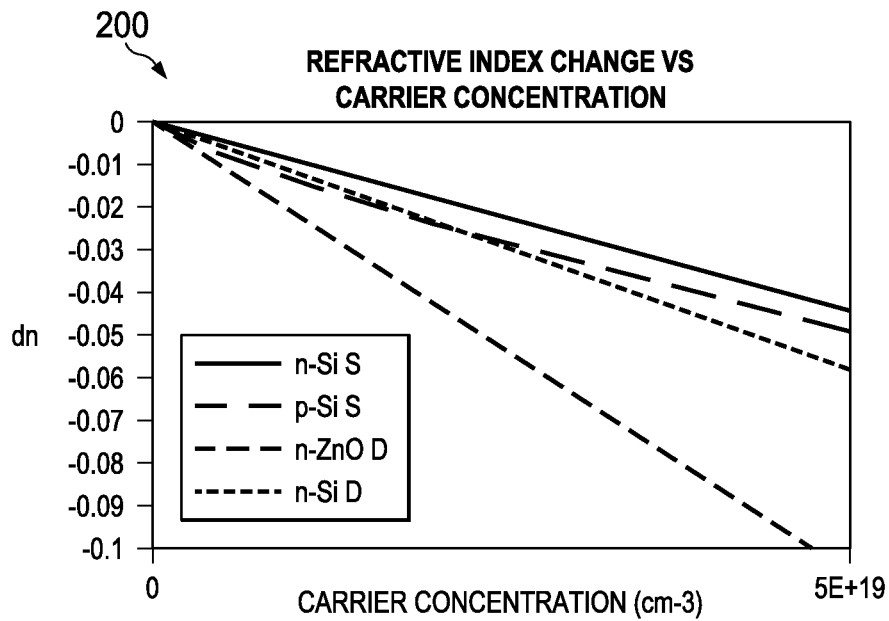
FIG. 2 is a graph of refractive index versus carrier density for silicon and zinc oxide.

FIG. 2 is a graph 200 of refractive index versus carrier density for silicon and zinc oxide. For example, the refractive index of the zinc oxide gate region 124 in FIG. 1 changes more than the refractive index of the silicon of the upper semiconductor layer 108 at the source and drain and the silicon in the semiconductor substrate 104 as the carrier density increases. For zinc oxide, the refractive index versus carrier density was based on Drude's model similar to that described in Eyal Feigenbaum, et al., "Unity-Order Index Change in Transparent Conducting Oxides at Visible Frequencies," American Chemical Society, 2010, which is incorporated herein in its entirety. For silicon, the refractive index versus carrier density was based on Soref's model similar to that described in Richard A. Soref, et al., "Electrooptical Effects in Silicon," The Institute of Electrical and Electronics Engineers (IEEE) Journal of Quantum Mechanics, Vol. QE-23, January 1987, which is incorporated herein in its entirety.

Figure 3:
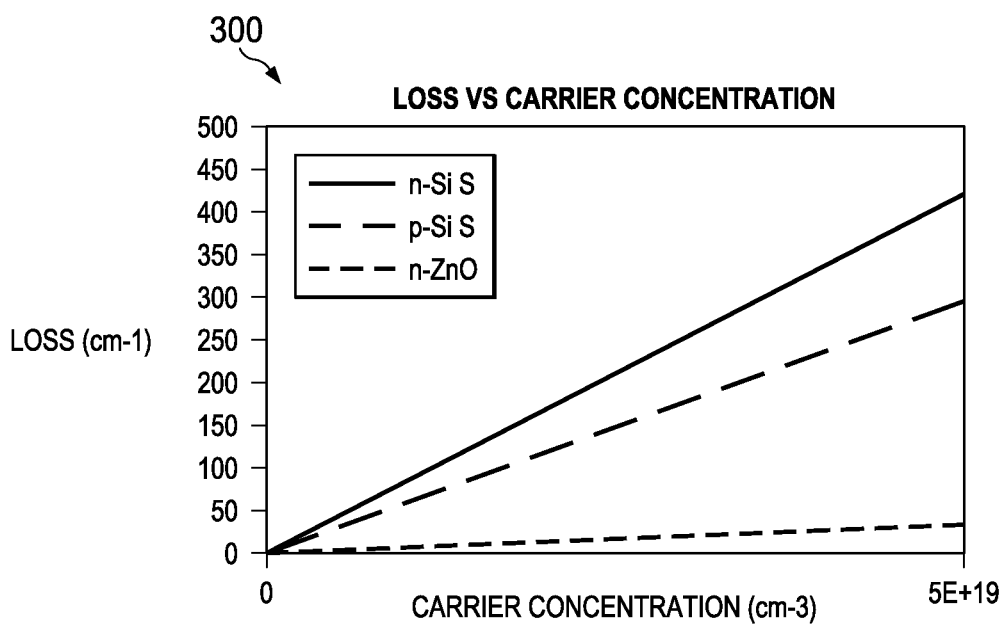
FIG. 3 is a graph of loss versus carrier density for silicon and zinc oxide.

FIG. 3 is a graph 300 of loss versus carrier density for silicon and zinc oxide. For zinc oxide, the loss versus carrier density was based on Guoyang Xu, et al., "Organic electro-optic modulator using transparent conducting oxides as electrodes," Optical Society of America, 2005. Xu provides a loss versus carrier density of 20 reciprocal centimeters ($cm^{-1}$) with an n-doping concentration of $3 \times 10^{19}$ atoms per $cm^3$ at 1,550 nm wavelength. As provided in S. M. Sze, et al., "Physics of Semiconductor Devices," Third Edition, Wiley, 2007, the effective mass of zinc oxide is 0.27. For silicon, the loss versus carrier density was again based on Soref's model.

Figure 4:
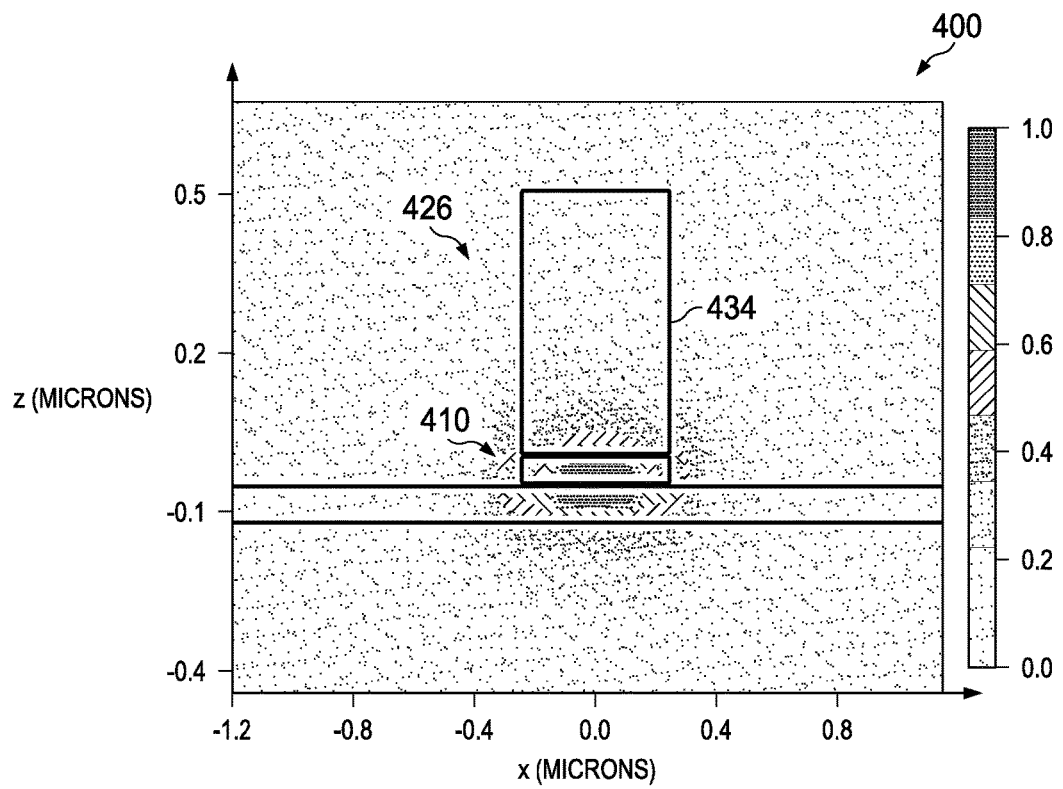
FIG. 4 is a graph of the optical mode of the modulator of FIG. 1.

FIG. 4 is a graph 400 of the optical mode of the modulator 100 of FIG. 1. As shown, the etched waveguide 426 (e.g., similar to waveguide 126 of FIG. 1) may laterally confine the optical field, and the silicon 410 (e.g., similar to waveguide structure 110 of upper semiconductor layer 108 of FIG. 1) may vertically confine the optical field. The light at the top of the waveguide may be decreased significantly so that it will not be absorbed by the metal contact 434 (e.g., metal contact 134 of FIG. 1) of the gate.

Figure 6:
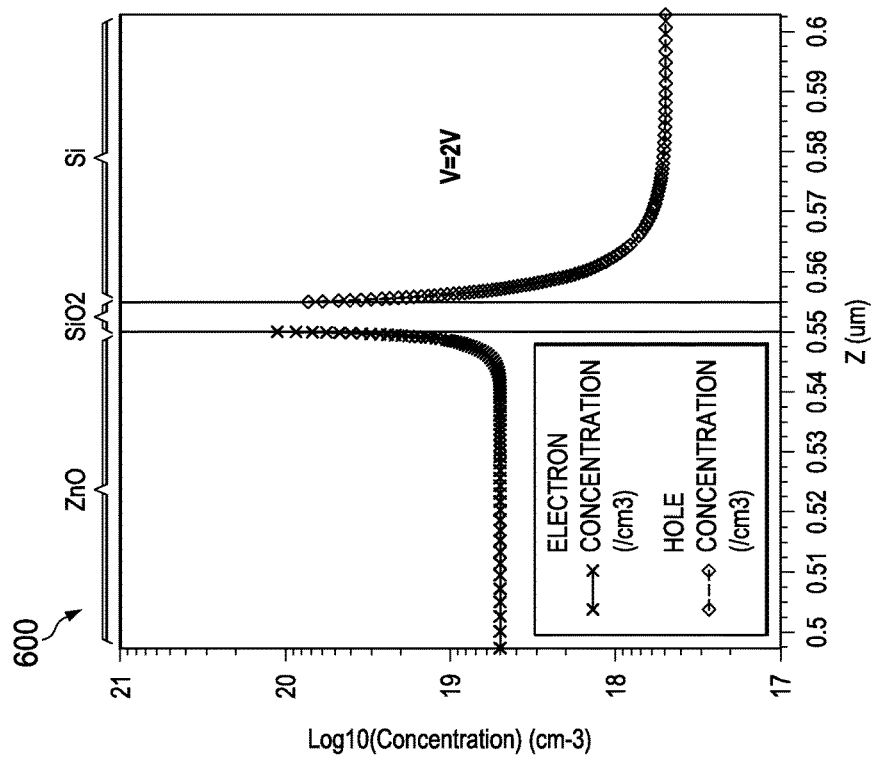
FIG. 6 is another graph of carrier density distribution at the center of the waveguide along the vertical direction of the modulator of FIG. 1.
Figure 5:
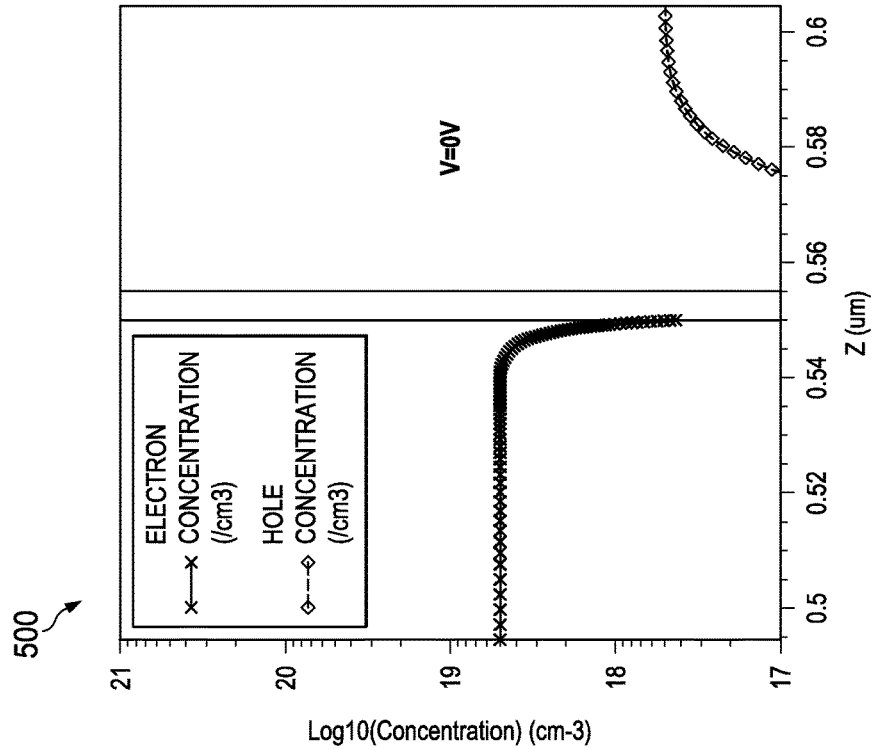
FIG. 5 is a graph of carrier density distribution at the center of the waveguide along the vertical direction of the modulator of FIG. 1.

FIG. 5 is a graph 500 of carrier density distribution at the center of the waveguide (e.g., waveguide 126 of FIG. 1) along the vertical direction of the modulator 100 of FIG. 1. The graph 500 may be for an applied voltage of zero volts (V). FIG. 6 is another graph 600 of carrier density distribution at the center of the waveguide along the vertical direction of the modulator 100 of FIG. 1. The graph 600 may be for an applied voltage of –2 V. As collectively shown by the graphs 500, 600, the carrier density may increase significantly when voltage is applied. The applied voltage may change the effective index of the waveguide, which may change the phase of the waveguide.

Figure 7:
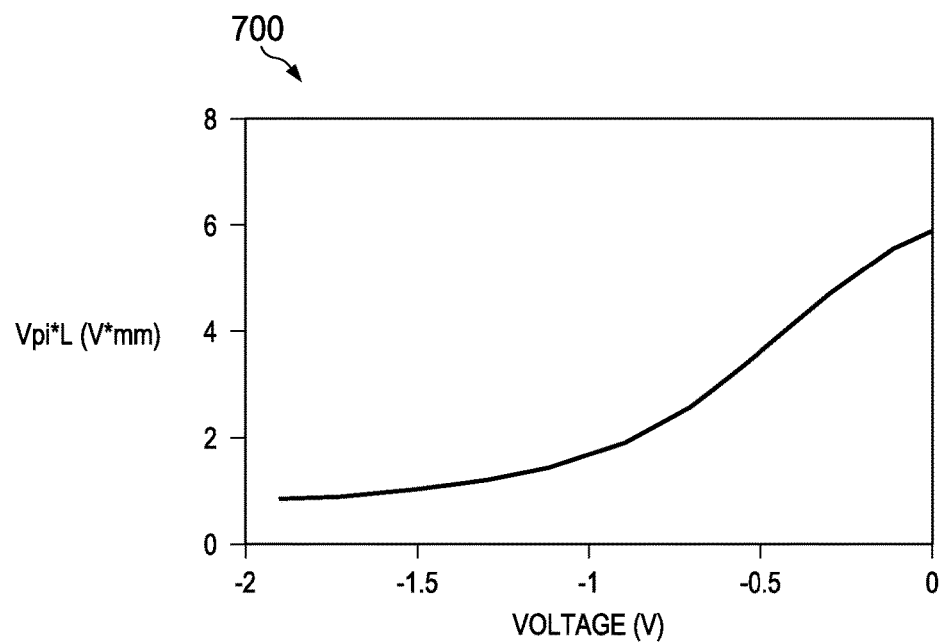
FIG. 7 is graph illustrating the modulator efficiency versus applied voltage for the modulator of FIG. 1.
Figure 8:
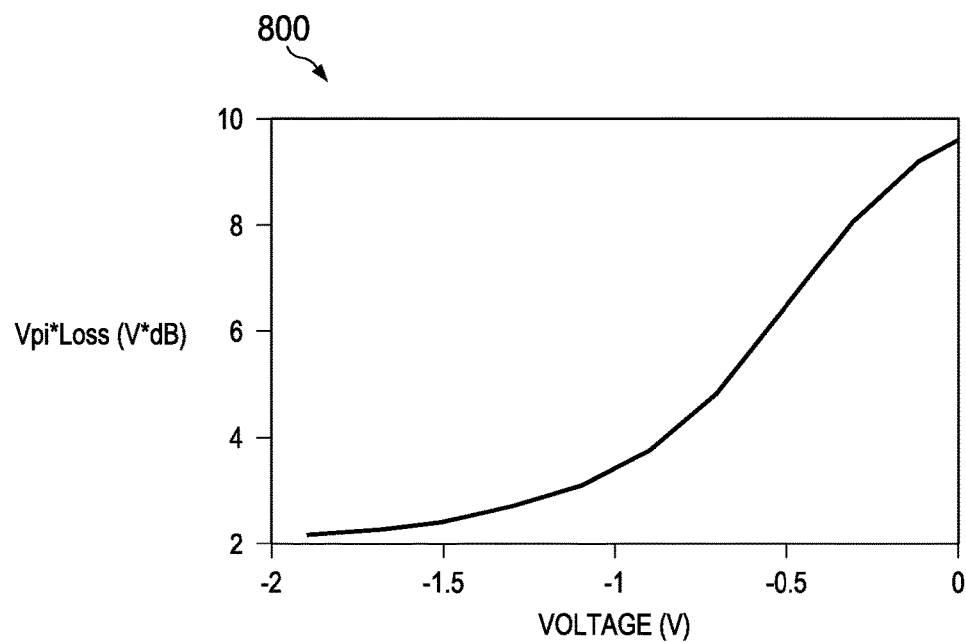
FIG. 8 is graph illustrating the insertion loss versus applied voltage for the modulator of FIG. 1.

FIG. 7 is a graph 700 showing the modulator efficiency versus applied voltage of the modulator 100 of FIG. 1. The modulation efficiency may be defined as Vπ*L and measured in volts*millimeter (mm). FIG. 8 is a graph 800 of the insertion loss versus applied voltage of the modulator 100 of FIG. 1. The insertion loss may be defined as Vπ*Loss and measured in volts*decibel (dB). The calculated 3 dB modulation bandwidth is about 18 gigahertz (GHz) at –1.5 V. Thus, the modulator 100 of FIG. 1 may exhibit high efficiency and low loss. It should be understood that with further optimization of dimensions and doping, the modulator 100 may provide more improved modulation efficiency and bandwidth. Optimizing the doping may provide for higher speed, and optimizing the optical mode overlap with the gate oxide region may provide for higher efficiency. Table 1 shows modulation speed values for the modulator 100 at various frequencies.

TABLE 1

| | Modulation speed values | | |
|---|---|---|---|
| AC frequency (GHz) | Resistance (Ohm/mm) | Capacitance (pF/mm) | f3dB (GHz) |
| 0.0004 | 2.5 | 3.5 | 18.3 |
| 0.0016 | 2.5 | 3.5 | 17.8 |
| 0.0064 | 2.5 | 3.5 | 17.8 |
| 0.0256 | 2.5 | 3.5 | 17.8 |
| 0.1020 | 2.5 | 3.5 | 17.8 |
| 0.4100 | 2.5 | 3.5 | 17.8 |
| 1.6400 | 2.5 | 3.5 | 17.8 |
| 6.5500 | 2.5 | 3.5 | 17.9 |
| 26.2000 | 2.5 | 3.3 | 18.9 | where pF represents picofarad.

Figure 9:
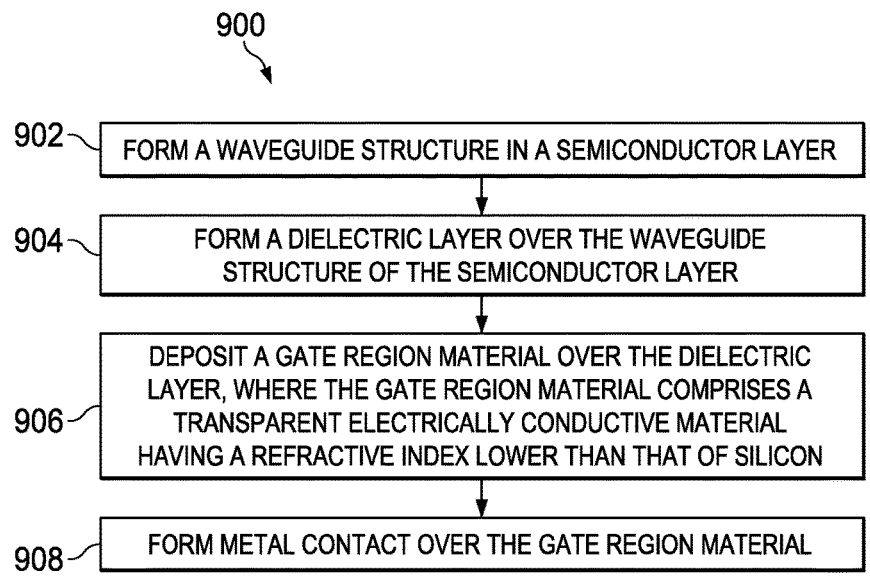
FIG. 9 is a flowchart illustrating a method of forming the MOS capacitor optical modulator of FIG. 1 according to an embodiment of the disclosure.

FIG. 9 is a flowchart illustrating a method of forming the modulator 100 of FIG. 1 according to an embodiment. In block 902, a waveguide structure (e.g., waveguide structure 110) is formed in a semiconductor layer (e.g., upper semiconductor layer 108). In block 904, a dielectric layer (e.g., dielectric layer 118) is formed over the waveguide structure of the semiconductor layer. In block 906, a gate region material (e.g., zinc oxide) is deposited over the dielectric layer. The gate region material comprises a transparent electrically conductive material having a refractive index lower than that of silicon. In an embodiment, the gate region material is deposited by one of the following processes: metal organic chemical vapor deposition (MOCVD), radio frequency (RF) sputtering, or plasma enhanced atomic layer deposition. In block 908, a metal contact (e.g., metal contact 134) is formed over the gate region material.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A metal-oxide semiconductor (MOS) capacitor optical modulator, comprising:
    a doped semiconductor layer having a waveguide structure;
    a dielectric layer disposed over the waveguide structure of the doped semiconductor layer, wherein a first surface of the dielectric layer is coupled to the doped semiconductor layer having a waveguide structure;
    a gate region disposed directly above the dielectric layer and the waveguide structure of the doped semiconductor layer, wherein a second surface of the dielectric layer is coupled to the gate region, wherein the gate region comprises a transparent electrically conductive material having a refractive index lower than that of silicon, and wherein the gate region, the dielectric layer, the waveguide structure collectively form a waveguide of the MOS capacitor optical modulator, the doped semiconductor layer comprising at least two etched out portions positioned on opposite sides of the gate region, each of the etched out portions comprising sidewalls that are coplanar with sidewalls of the gate region;
    a metal contact disposed over the gate region, sidewalls of the metal contact being coplanar with the sidewalls of the gate region; and
    a cladding material covering the etched out portions, the sidewalls of the gate region, and the sidewalls of the metal contact.

2. The MOS capacitor optical modulator of claim 1, wherein the metal contact, the gate region, and the waveguide structure of the doped semiconductor layer are vertically aligned with each other.

3. The MOS capacitor optical modulator of claim 1, wherein the gate region is an n-doped zinc oxide (ZnO).

4. The MOS capacitor optical modulator of claim 1, wherein the doped semiconductor layer is a p-doped silicon, and wherein the gate region is one of an n-doped zinc oxide (ZnO), an n-doped silicon carbide (SiC), and an n-doped indium tin oxide (ITO).

5. The MOS capacitor optical modulator of claim 1, wherein the gate region is transparent in an optical telecommunications wavelength band between 1.3 micrometers (μm) and 1.55 μm.

6. The MOS capacitor optical modulator of claim 1, wherein the cladding material is a silicon dioxide ($SiO_2$) cladding material, and wherein the refractive index of the gate region is higher than that of the $SiO_2$ cladding material.

7. The MOS capacitor optical modulator of claim 1, wherein the dielectric layer is a gate oxide comprising one of silica and silicon nitride.

8. The MOS capacitor optical modulator of claim 1, wherein the metal contact is disposed directly above the gate region.

9. The MOS capacitor optical modulator of claim 1, wherein the doped semiconductor layer is an upper layer of a semiconductor-on-insulator (SOI) wafer.

10. A metal-oxide semiconductor (MOS) capacitor optical modulator, comprising:
    a semiconductor-on-insulator (SOI) wafer portion having an upper semiconductor layer disposed over a buried oxide formed on a semiconductor substrate, wherein the upper semiconductor layer includes a waveguide structure;
    a dielectric layer disposed over the waveguide structure of the upper semiconductor layer, wherein a first surface of the dielectric layer is coupled to the doped semiconductor layer having a waveguide structure;
    a gate region disposed directly above the dielectric layer and the waveguide structure of the upper semiconductor layer, wherein a second surface of the dielectric layer is coupled to the gate region, wherein the gate region comprises a transparent electrically conductive material having a refractive index lower than that of silicon, and wherein the gate region, the dielectric layer, the waveguide structure collectively form a waveguide of the MOS capacitor optical modulator, the doped semiconductor layer comprising at least two etched out portions positioned on opposite sides of the gate region, each of the etched out portions comprising sidewalls that are coplanar with sidewalls of the gate region;

a metal contact disposed directly above the gate region and the waveguide structure of the upper semiconductor layer, sidewalls of the metal contact being coplanar with the sidewalls of the gate region; and a cladding material covering the etched out portions, the sidewalls of the gate region, and the sidewalls of the metal contact.

11. The MOS capacitor optical modulator of claim 10, wherein the upper semiconductor layer is a p-doped silicon-containing material, and wherein the gate region is an n-doped zinc oxide (ZnO).

12. The MOS capacitor optical modulator of claim 10, wherein the gate region is transparent in an optical telecommunications wavelength band between 1.3 micrometers (μm) and 1.55 μm.

13. The MOS capacitor optical modulator of claim 10, wherein the cladding material is a silicon dioxide ($SiO_2$) cladding material, and wherein the refractive index of the gate region is higher than that of the $SiO_2$ cladding material.

14. The MOS capacitor optical modulator of claim 10, wherein a doping concentration of the upper semiconductor layer proximate a source of the MOS capacitor optical modulator is less than a doping concentration of the upper semiconductor layer proximate a drain of the MOS capacitor optical modulator.

15. The MOS capacitor optical modulator of claim 10, wherein a second metal contact is laterally spaced apart from the gate region by cladding material and disposed upon the upper semiconductor layer.

16. The MOS capacitor optical modulator of claim 10, wherein the gate region and the buried oxide are physically separated by the upper semiconductor layer along an entire bottom surface of the gate region.

17. A method of forming a metal-oxide semiconductor (MOS) capacitor optical modulator, comprising:

forming a waveguide structure in a semiconductor layer;

forming a dielectric layer over the waveguide structure of the semiconductor layer, wherein a first surface of the dielectric layer is coupled to the doped semiconductor layer having a waveguide structure;

depositing a gate region material directly above the dielectric layer and the waveguide structure of the semiconductor layer, wherein a second surface of the dielectric layer is coupled to the gate region, wherein the gate region material comprises a transparent electrically conductive material having a refractive index lower than that of silicon, wherein the gate region, the dielectric layer, and the waveguide structure collectively form a waveguide of the MOS capacitor optical modulator, the doped semiconductor layer comprising at least two etched out portions positioned on opposite sides of the gate region, each of the etched out portions comprising sidewalls that are coplanar with sidewalls of the gate region;

forming a metal contact over the gate region material, sidewalls of the metal contact being coplanar with the sidewalls of the gate region; and depositing a cladding material to cover the etched out portions, the sidewalls of the gate region, and the sidewalls of the metal contact.

18. The method of claim 17, further comprising vertically aligning the metal contact, the gate region material, and the waveguide structure of the semiconductor layer.

19. The method of claim 17, further comprising depositing the gate region material by one of metal organic chemical vapor deposition (MOCVD), radio frequency (RF) sputtering, and plasma enhanced atomic layer deposition.

20. The method of claim 17, further comprising etching the semiconductor layer to form the waveguide structure, and implanting the gate region material with a first dopant and the semiconductor layer with a second dopant different than the first dopant.

* * * * *